United States Patent [19]
Uno

[11] Patent Number: 5,322,994
[45] Date of Patent: Jun. 21, 1994

[54] SOLID STATE IMAGE PICKUP DEVICE HAVING A RELIABLE PHOTOELECTRIC DETECTION CELL

[75] Inventor: Masayuki Uno, Ina, Japan

[73] Assignee: Olympus Optical Co., Ltd., Tokyo, Japan

[21] Appl. No.: 1,654

[22] Filed: Jan. 7, 1993

[30] Foreign Application Priority Data

Jan. 29, 1992 [JP] Japan .................. 4-036922

[51] Int. Cl.[5] ............................................. H01J 40/14
[52] U.S. Cl. .................. 250/208.1; 250/214 A
[58] Field of Search ............ 250/208.1, 214 A, 214 R; 358/213.16, 213.26, 213.31; 307/311

[56] References Cited

U.S. PATENT DOCUMENTS

| | | | |
|---|---|---|---|
| 4,382,187 | 5/1983 | Fraleux et al. | 250/208.1 |
| 4,786,831 | 11/1988 | Morse et al. | 307/490 |
| 5,029,276 | 7/1991 | Buehler et al. | 250/214 A |
| 5,043,820 | 8/1991 | Wyles et al. | 250/208.1 |
| 5,149,954 | 9/1992 | Pettijohn et al. | 250/208.1 |
| 5,168,153 | 12/1992 | Ikeda | 250/214 A |
| 5,198,660 | 3/1993 | Yokoyama et al. | 250/218 A |
| 5,214,274 | 5/1993 | Yang | 250/208.1 |

OTHER PUBLICATIONS

Toshifumi Ozakai et al., "Line Amplified MOS Imaging Device, Analysis of Fundamental Characteristics", ITEJ Technical Report, vol. 14, No. 16, pp. 25-30 (Feb. 1990).

Primary Examiner—David C. Nelms
Attorney, Agent, or Firm—Armstrong, Westerman, Hattori, McLeland & Naughton

[57] ABSTRACT

A solid state image pickup device is composed of basic cells each of which comprises a photodiode one terminal of which is grounded, a n-MOS transistor whose gate is connected to the other terminal of the photodiode and whose source is grounded and furthermore whose drain is connected to a load, a feedback capacitor and switching element for resetting both of which are connected between the drain and gate of the n-MOS transistor. As an advantage of such a configuration, the reduction of the sensitivity due to the junction capacitance of the photodiode can be suppressed, and furthermore accurate signal output voltages can be obtained even in the case where the amount of incident light changes during an integration period.

11 Claims, 13 Drawing Sheets

SOLID STATE IMAGE PICKUP DEVICE HAVING A RELIABLE PHOTOELECTRIC DETECTION CELL

BACKGROUND OF THE INVENTION

The present invention relates to a solid state image pickup device which is improved to avoid the reduction in sensitivity caused by the junction capacitance of a photodiode, and to obtain accurate signal output voltage regardless of the change in amount of incident light during an integration period.

In addition to MOS and CCD type devices, there are known amplification type solid state image pickup devices, such as AMI, SIT, CMD, BASIS, FGA, and BCMD. These amplification type solid state image pickup devices do not show problems as far as the size of a pixel is small enough. However, in some applications requiring rather large pixels (such as auto, focusing (AF) control of cameras), these amplification type solid state image pickup devices have problems as described later.

The problems will now be described, while taking into account an AMI (amplified MOS Imager), as an example. FIG. 1 shows a circuit configuration of one pixel of a normal AMI, comprising a photodiode 101, a transistor Q1 for amplification, bias transistors Q2 and Q3, a transistor Q4 for resetting, a bias circuit 102, and a switching transistor 103 driven by output pulses from a shiftregister. The signal output voltage of photoelectric conversion of an AMI configured in such a manner is provided by $$\Delta V_{OUT} = I_P t/Cd \qquad (1)$$

where $I_p$ is a photocurrent, t is an integration period, Cd is a junction capacitance of the photodiode 101. As can be seen from this equation (1), in order to increase the signal output voltage $\Delta V_{OUT}$ under the condition of a constant integration period, it is necessary to increase the photocurrent $I_P$ or decrease the junction capacitance Cd. However, the increase of the photocurrent requires the increase of the area of a pixel. Therefore, this increase of the area of the pixel leads to the increase of the junction capacitance Cd. On the other hand, the reduction of the junction capacitance Cd requires the reduction of the area of the pixel. Subsequently, the reduction of the area of the pixel results in the reduction of the photocurrent. Hence, it is not possible to improve the sensitivity as far as the conventional circuit configuration of the AMI is concerned.

As one of means to solve the above problem, a solid state image pickup device having a configuration shown in FIG. 2 is disclosed in "A New MOS Imager Using Photodiode as Current Source", IEEE Journal of Solid-State-Circuits, Vol. 26, No. 8, Aug., 1991. The configuration of this solid state image pickup device can be obtained from the configuration of the solid state image pickup device shown in FIG. 1 by adding transfer gate transistors Q5 and Q6, and further adding a storage capacitor Ct between the photodiode 101 and the transistor Q1 for amplification. In this configuration of the solid state image pickup device, the transistor Q5 is turned on by data signal during the integration period, so that the transistor Q5 operates in a saturation region, thus the voltage applied to the photodiode 101 is fixed to a voltage lower than the gate voltage of the transistor Q5 by gate-source voltage $V_{GS}$. As a result, photo charges generated in the photodiode 101 are stored via the transistor Q5 in the storage capacitor Ct connected to the gate of the transistor Q1 for amplification. Consequently, the affection of the junction capacitance Cd of the photodiode 101 is removed and the signal output voltage $\Delta V_{OUT}$ of the photoelectric conversion is provided by $$\Delta V_{OUT} = I_P t/Ct. \qquad (2)$$

As can be seen from equation (2), the signal output voltage $\Delta V_{OUT}$ can be increased by reducing the capacitance of the storage capacitor Ct. That is, the sensitivity can be determined independently of the junction capacitance of the photodiode.

However, the configuration shown in FIG. 2 of the solid state image pickup device has the following problems. If the amount of incident light is kept constant during the integration period, no problem occurs because the current (photocurrent $I_P$) flowing in the transistor Q5 is kept constant. However, if the amount of the incident light changes in the integration period, the current flowing in the transistor Q5 changes. As a result, the gate-source voltage $V_{GS}$ of the transistor Q5 changes, thus a transfer of charges occurs between the junction capacitance Cd of the photodiode and the storage capacitor Ct. This leads to the problem of making it impossible to obtain the accurate photoelectric conversion output.

SUMMARY OF THE INVENTION

It is an object of the present invention to solve the problems described above. More specifically, it is an object of the present invention to provide a solid state image pickup device which is improved in order to suppress the reduction in sensitivity due to the junction capacitance of a photodiode, and to obtain accurate signal output voltage regardless of the change in the amount of incident light during an integration period.

To solve the above-described problem, in a solid state image pickup device according to the present invention, there is provided a photoelectric conversion detecting cell comprising a photodiode whose anode or cathode is grounded, an amplification transistor whose gate is connected to the cathode or anode of the photodiode and whose source is grounded and furthermore whose drain is connected to a load, a feedback capacitor and a switching transistor for resetting connected between the drain and the gate of the amplification transistor, wherein the photoelectric conversion detecting cell is configured so that the amount of incident light of the photodiode is converted to the change in the drain voltage of the amplification transistor.

As for the signal output voltage of photoelectric conversion in such a configuration of the solid state image pickup device, the affection of the junction capacitance of the photodiode can be suppressed by increasing the gain of the common-source amplification transistor. As a result, the capacitance of the feedback capacitor connected between the gate and drain of the amplification transistor is reduced, thus the output voltage is increased. In other words, the sensitivity can be enhanced. Furthermore, the change in bias current due to the change of the photocurrent can be neglected, if the bias current of the amplification transistor is set to a large enough value compared to the photocurrent. Thus, the accurate photoelectric conversion output can be obtained regardless of the change in the amount of light.

DESCRIPTION OF THE PREFERRED EMBODIMENTS

Figure 1:
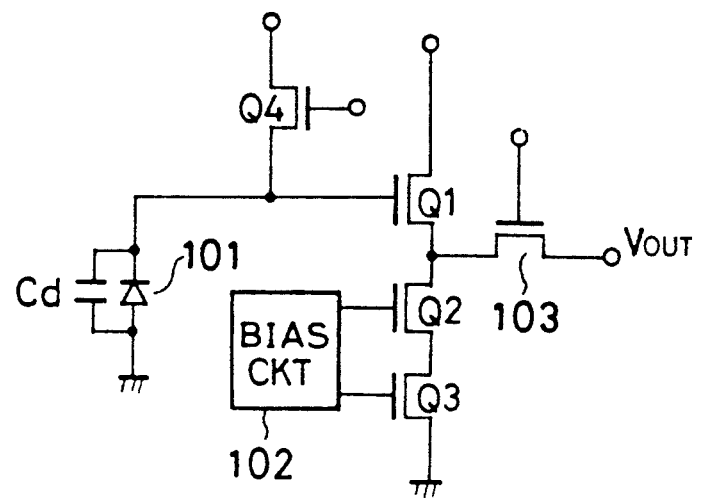
FIG. 1 is a circuit diagram showing a configuration of a conventional AMI.
Figure 2:
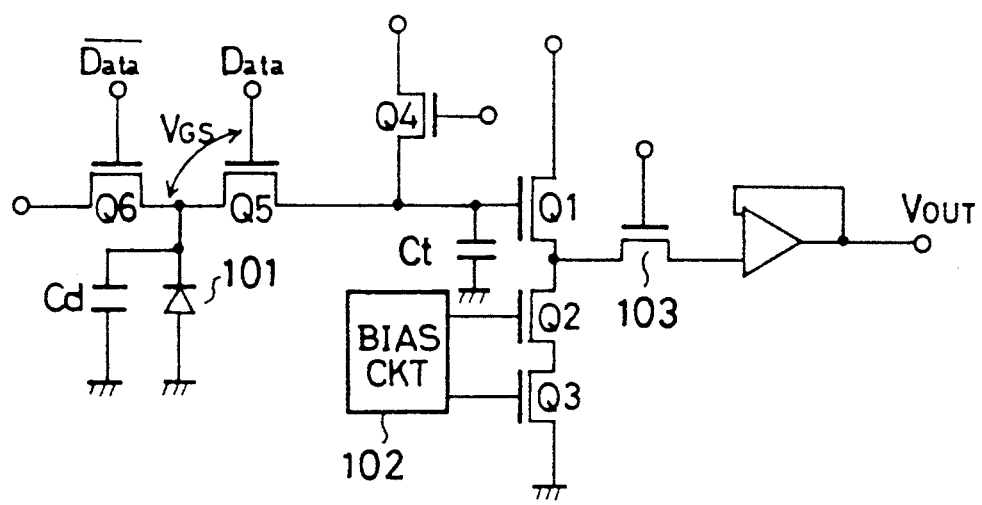
FIG. 2 is a circuit diagram showing an improved configuration of a conventional AMI.
Figure 3:
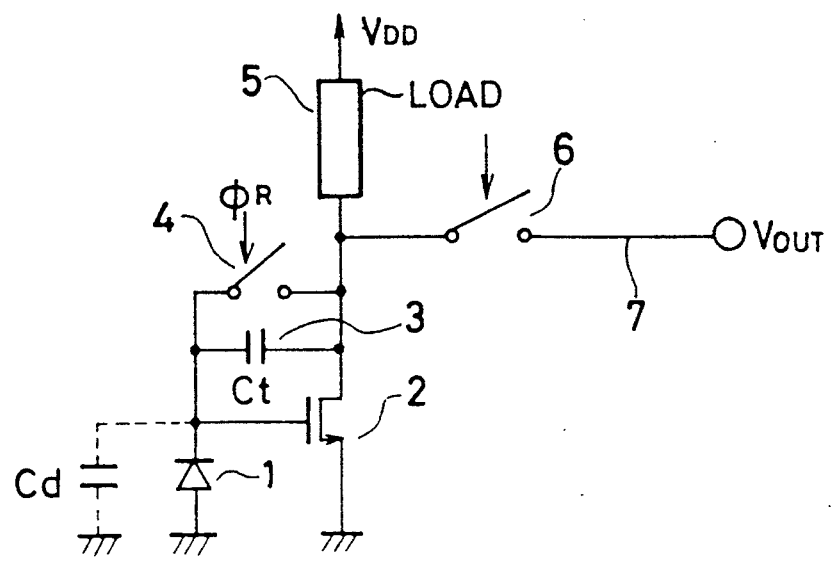
FIG. 3 is a circuit diagram showing a basic embodiment of a basic cell for use in a solid state image pickup device according to the present invention.

Now, preferred embodiments of the present invention will be described. FIG. 3 is a circuit diagram showing a basic embodiment of a basic cell used in a solid state image pickup device according to the present invention. In FIG. 3, 1 is a photodiode, 2 is a n-MOS transistor forming a common-source amplifier wherein the source is grounded and the drain is connected to a load 5. The input of this common-source amplifier, that is, the gate of the n-MOS transistor 2, is connected to the photodiode 1. A capacitor 3 is connected between the output of the common-source amplifier, that is, the drain of the n-MOS transistor 2, and the input of the common-source amplifier (the gate of the n-MOS transistor 2), so that the output is fed back to the input. A reset switching element 4 is connected in parallel to the capacitor 3, whereby the initial gate voltage of the n-MOS transistor 2 is set. Using this circuit configuration as a basic cell (pixel), the basic cells are arranged in 1-dimensional or a 2-dimensional form. Furthermore, there is provided a switching element 6 which is driven by shiftregister pulses to select a reading pixel. When the switching element 6 is turned on, the drain voltage of the n-MOS transistor 2 appears on a signal output line 7.

Now, the operation of the solid state image pickup device configured in such a manner will be described. First, before starting integration, a reset pulse $\phi_R$ makes the reset switching element 4 turned on to perform resetting operation. Then, when the reset switching 4 is turned off, the integration starts. After a given integration period, the switching element 6 is turned on. Then, the signal output $V_{OUT}$, described by the following equation (3), is obtained on the signal output line 7:

$$V_{OUT} = V_{GS} + I_p \cdot t / \{(1 + 1/G)Ct + 1/G \cdot Cd\}, \quad (3)$$

where $V_{GS}$ is a voltage which appears between the gate and source of the n-MOS transistor 2 when the reset is carried out. This voltage is also equal to a drain voltage at the time of resetting. G is a gain of the common-source amplifier, Ct is a capacitance of the capacitor 3, Cd is a junction capacitance of the photodiode 1·$I_p$ and t are a photocurrent and a integration period, respectively, as in the previous equation.

As can be seen from equation (3), the influence of the junction capacitance Cd of the photodiode 1 on the change in the output signal of the photoelectric conversion can be suppressed by increasing the gain G of the common-source amplifier. Furthermore, if the capacitance Ct of the feedback capacitor 3 is reduced, the output voltage $V_{OUT}$ can be increased, i.e., the sensitivity can be enhanced.

Operation will be described next for the case where the amount of light changes during the integration period. The change in the amount of light during the integration results in the change in the current which flows to charge the capacitor 3. This causes the change in the bias current of the n-MOS transistor 2, thus leading to the change in $V_{GS}$. However, if the bias current of the n-MOS transistor 2 is set to the value larger enough than the photocurrent, the change in the bias current due to the change in the photocurrent can be neglected. Thus, the accurate enough photoelectric conversion output can be obtained even in the case where the amount of light changes.

Figure 4:
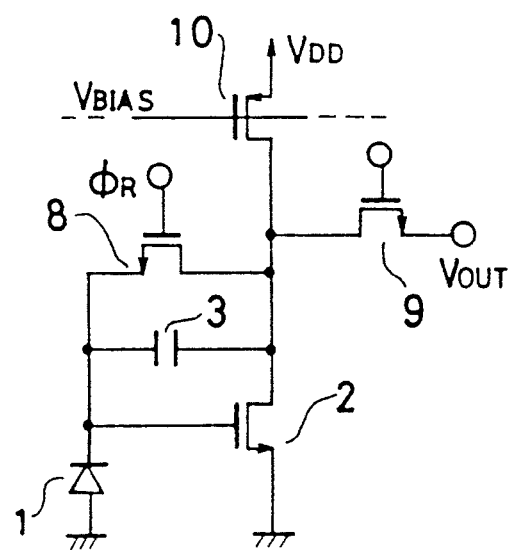
FIG. 4 is a circuit diagram showing an embodiment example of a basic cell for use in a solid state image pickup device according to the present invention.

Now, referring to FIG. 4, an embodiment example will be described. FIG. 4 is a circuit diagram showing a basic cell for use to form a solid state image pickup device. In this embodiment, a reset switching element is composed of a n-MOS transistor 8; a pixel selection switching element is composed of a n-MOS transistor 9; and a load of a common-source amplifier is composed of an active load of p-MOS transistor 10. The operation of this embodiment is exactly the same as the operation of the embodiment shown in FIG. 3.

Figure 5:
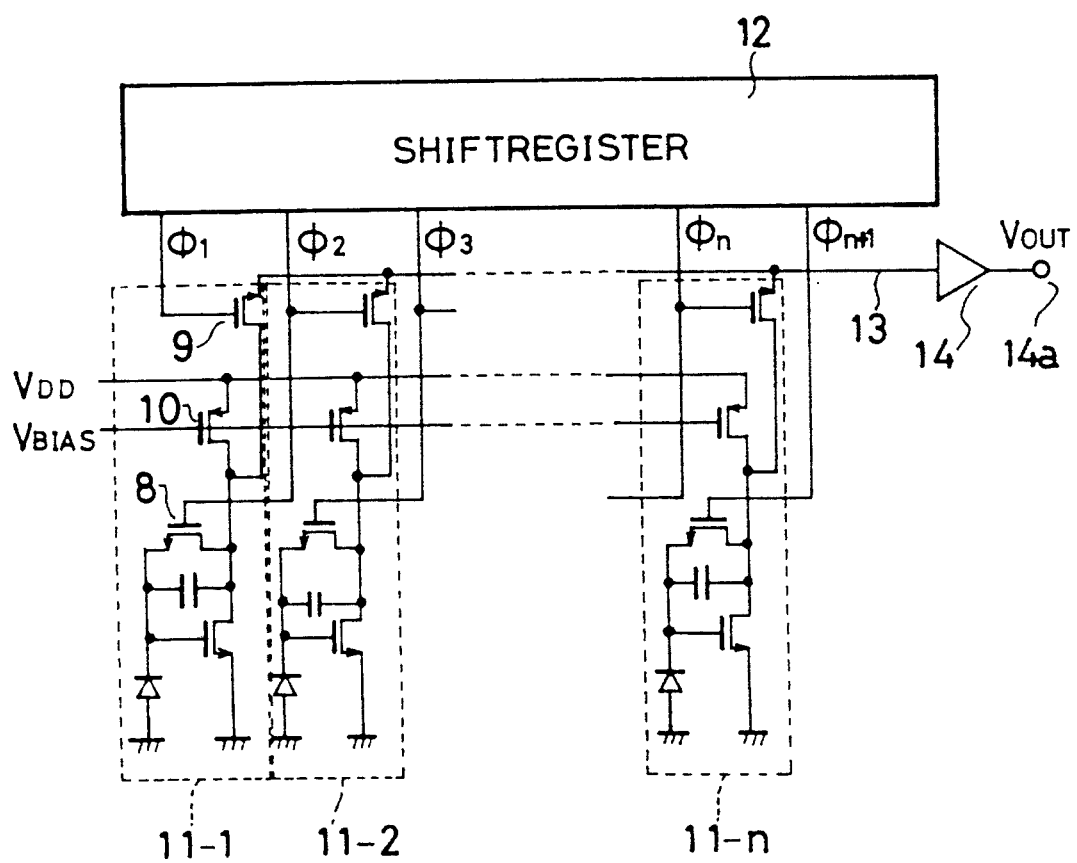
FIG. 5 is a circuit diagram showing an embodiment of a line sensor using a basic cell shown in FIG. 4.

FIG. 5 shows an embodiment of a line sensor in which n basic cells shown in FIG. 4 are arranged in a 1-dimensional form. In this figure, 11-1, 11-2, ..., 11-n are a unit pixel composed of a basic cell shown in FIG. 4; reference number 12 is a shiftregister for successively resetting and reading each unit pixel, and reference number 13 is a signal output line connected in common to n-MOS transistors 9 for selecting a pixel. The signal output line 13 is connected to an output terminal 14a via a buffer 14 so that a signal output $V_{OUT}$ is obtained from the output terminal 14a. Every gate of each active load p-MOS transistor 10 of each unit element 11-1, 11-2, ..., 11-n, is connected together in common so that a bias voltage $V_{BIAS}$ is applied to each gate. Every source of each active load p-MOS transistor 10 is connected together in common so that a supply voltage $V_{DD}$ is applied to each source. The integration period for each pixel is defined as a period from the time when a reset n-MOS transistor 8 is turned off to the time when the pixel selection n-MOS transistor 9 is turned on by the shiftregister 12. In view of this, in order to make the integration period of every pixel the same, the gate of a reading-pixel selection n-MOS transistor 9 of a certain pixel is connected to the gate of the reset n-MOS transistor 8 of the prior pixel so that reading and resetting are carried out successively for every pixel.

Figure 6:
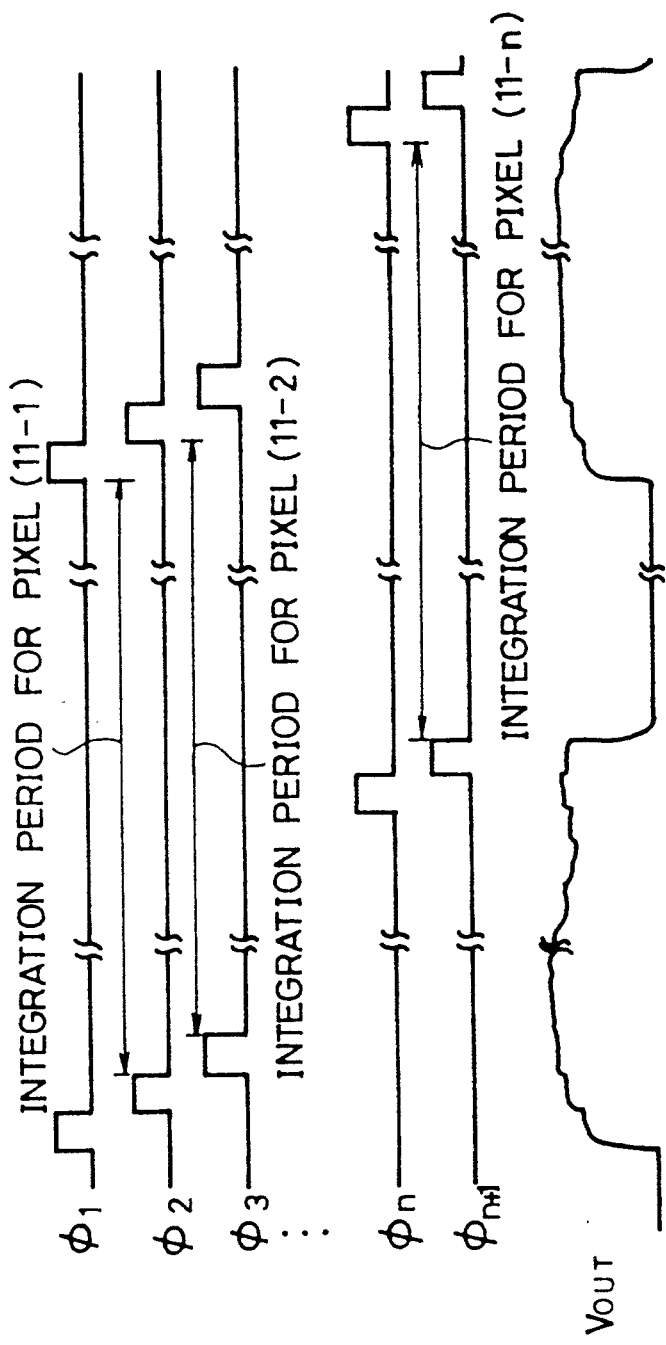
FIG. 6 is a timing chart for explaining an operation of the embodiment shown in FIG. 5.

FIG. 6 is a timing chart showing output pulses $\phi_1, \phi_2, \ldots$, of the shiftregister 12. FIG. 6 also shows the signal output voltage $V_{OUT}$ and the integration period of each pixel. As can be seen from this figure, the integration period is the same for every pixel. However, there exists the difference in the time for each pixel to start integration, by difference in reading time. The signal output voltage $V_{OUT}$ shown in FIG. 6 includes an offset voltage. In general, in order to cancel it, there are provided several pixels (not shown in FIG. 5) which are shielded from light, and by using the output voltages of these pixels shielded from light as a reference level, the difference between the signal output voltage $V_{OUT}$ and this reference level is treated as final signal output voltage.

Figure 7:
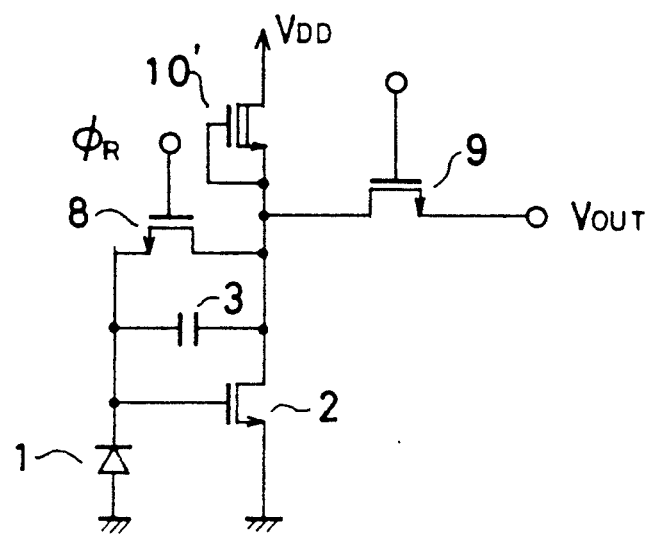
FIG. 7 is a circuit diagram showing another embodiment of the basic cell.

FIG. 7 is a circuit diagram showing another embodiment of the basic cell. This basic cell can be obtained by replacing the p-MOS active load of the basic cell according the embodiment shown in FIG. 4 by a depletion mode n-MOS transistor 10'. The operation and effect of this basic cell are similar to the operation of the basic cell shown in FIG. 4. Thus, this basic cell can be used to compose a line sensor in a manner similar to the case of the basic cell shown in FIG. 4.

Other modified configurations of the basic cell are possible; for example, a normal resistor load or n-MOS transistor of the same type as the n-MOS transistor 2 can be used as a load 5. However, the active load, shown in FIGS. 4 and 7, is more preferable to determine suitable bias current and gain of the n-MOS transistor 2 and to reduce the chip layout area.

Now, a description will hereinafter be provided on the bias applied to the photodiode during the integration period for the case of the embodiment of the basic cell shown in FIG. 4 or 7. In the basic cell shown in FIG. 4 or 7, the reset voltage is given by the source-gate voltage $V_{GS}$ of the n-MOS transistor 2. This voltage $V_{GS}$ depends on the threshold voltage $V_{TH}$ and the bias current of the n-MOS transistor 2. In order to make the bias current sufficiently larger than the photocurrent, and to suppress the current consumption at the same time, the bias current is limited in a narrow range. On the other hand, the threshold voltage $V_{TH}$ is determined by the chip fabrication process, and the threshold voltage $V_{TH}$ of the normal CMOS or n-MOS process is set to about 1 V. As a result, when normal n-MOS transistors are used, the reverse bias voltage is about 1 V during the integration period of the photodiode.

If the bias voltage applied to the photodiode is large, then the dark charge, i.e., a charge generated under the condition of no exposure to light generated in the photodiode is also large, which causes noise. To avoid this, the threshold voltage $V_{TH}$ of the n-MOS transistor 2 should be sufficiently small. This can be achieved by doping impurity in the channel region of the n-MOS transistor 2. Thus, it is possible to make a large reduction in the dark current by setting the threshold voltage $V_{TH}$ of such a n-MOS transistor to about 0.1 V.

Figure 8:
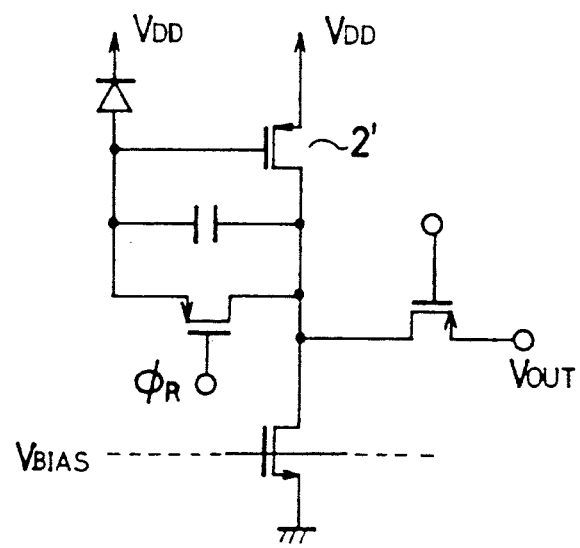
FIG. 8 is a circuit diagram showing yet another embodiment of the basic cell.

The above discussion on the embodiment of the basic cell assumes that a photodiode is formed by diffusing n-type impurity into a p-type substrate or p-well, and that a n-MOS transistor is used for a common-source transistor. However, as shown in FIG. 8, a photodiode formed by diffusing p-type impurity into a n-type substrate or n-well can be also used in conjunction with a p-MOS transistor 2' for a common-source transistor, to compose a basic cell which can perform a similar operation and has a similar effect. As for amplification, transistors, due to the gate current of transistors being small enough compared to the photocurrent of the photodiode, any transistor can be used to form a similar configuration of a basic cell in accordance with the present invention.

Figure 9:
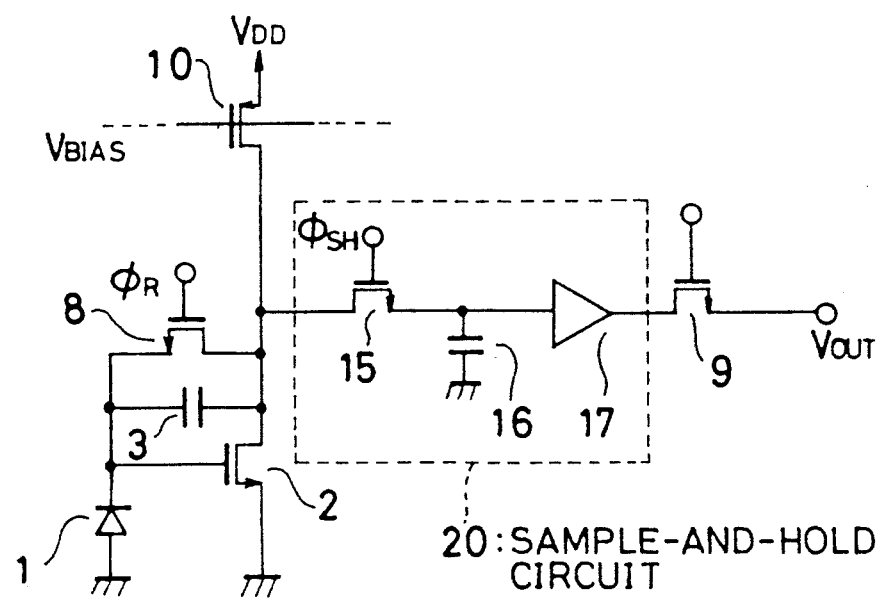
FIG. 9 is a circuit diagram showing still yet another embodiment of the basic cell.

In the case of the line sensor shown in FIG. 5, the integration period is the same for every pixel, while the integration starts or ends at different times for each pixel. Therefore, this line sensor cannot be used for applications which require data obtained at the same time. Now, an embodiment of a line sensor comprising basic cells arranged in a 1-dimensional form wherein the integration is carried out at the same time will be described. FIG. 9 is a diagram showing a circuit configuration of a basic cell forming one pixel. As in the case of the basic cell shown in FIG. 4, the basic cell of the present embodiment includes a photodiode 1, a n-MOS transistor 2, a capacitor 3, a reset n-MOS transistor 8, a pixel selection switching n-MOS transistor 9, and an active load p-MOS transistor 10. In addition, the basic cell of this embodiment further includes a sample-and-hold circuit 20 comprising a n-MOS transistor 15 operating as a switching element, a capacitor 16 for holding a voltage, and a buffer 17, wherein the sample-and-hold circuit 20 is added between the output terminal (drain) of the n-MOS transistor 2 and the pixel selection switching n-MOS transistor 9.

Figure 10:
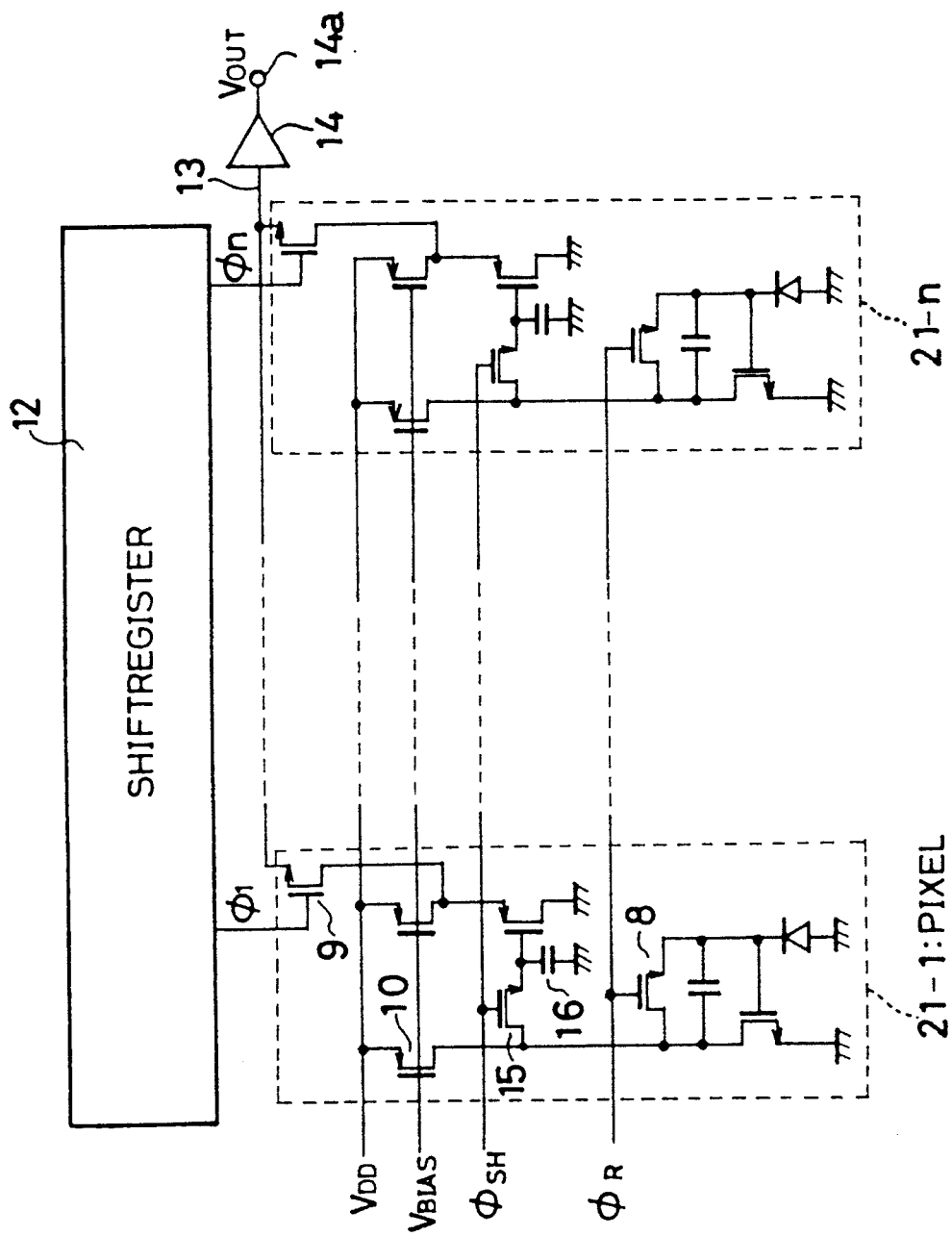
FIG. 10 is a circuit diagram showing an embodiment of a line sensor using a basic cell shown in FIG. 9.
Figure 11:
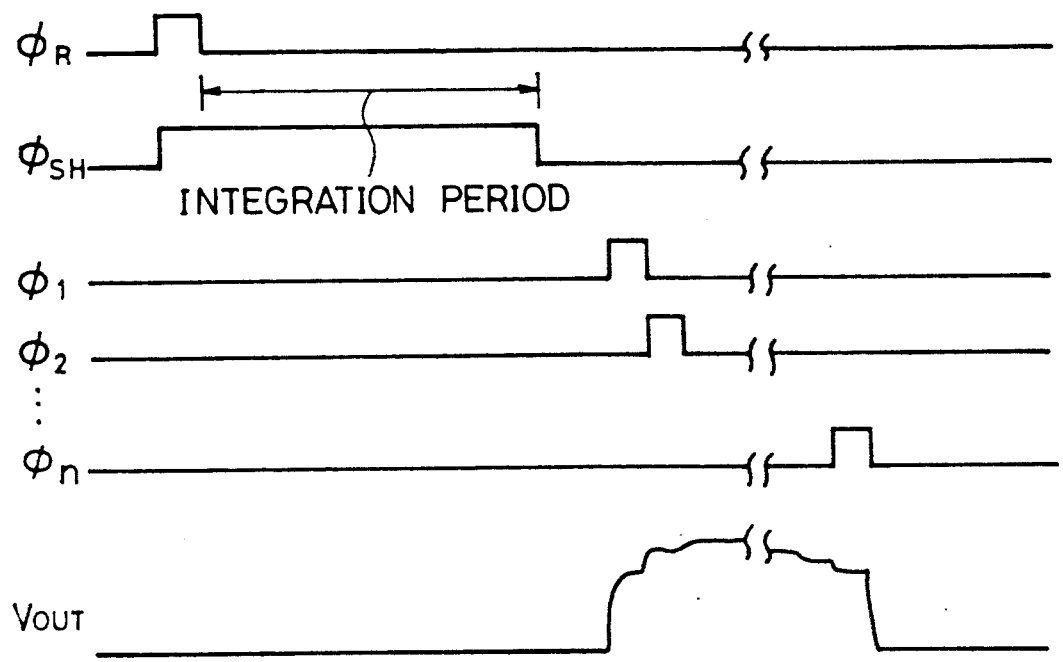
FIG. 11 is a timing chart for explaining the operation of the line sensor shown in FIG. 10.

FIG. 10 is a circuit diagram of a line sensor which includes an array of n basic cells having a buffer 17 composed of a p-MOS transistor source follower. A timing chart is shown in FIG. 11 for an explanation of the operation of this line sensor. In FIG. 10, elements equivalent or similar to the elements of the line sensor shown in FIG. 5 are denoted by the same numerals. Reference numbers 21-1, ... 21-n are pixels consisting of the basic cell shown in FIG. 9. The difference between the present embodiment and the embodiment shown in FIG. 5 is that, in the present embodiment, gates of the reset transistors 8 are connected together in common for all pixels so that the reset pulse $\phi_R$ is applied to all the gates, and gates of sample-and-hold n-MOS transistors 15 are also connected together in common for all pixels so that the sample-and-hold pulse $\phi_{SH}$ is applied to all the gates, thus making all the pixels 21-1, 21-2, ... 21-n turned on or off at the same time to achieve the simultaneous integration during the same integration period.

Referring to the timing chart of FIG. 11, the operation thereof will now be described. When the reset pulse $\phi_R$ of level 'H' is applied, the resetting is carried out simultaneously for all pixels. In this state, if the level of sample-and-hold pulse $\phi_{SH}$ is 'H', every capacitor 16 is also reset to the initial voltage. When the reset pulse $\phi_R$ is altered from 'H' level to 'L' level, the integration starts. The level of the sample-and-hold pulse $\phi_{SH}$ is kept at 'H' during the integration period. At the end of the integration, the level of the sample-and-hold pulse $\phi_{SH}$ is altered from 'H' to 'L' to turn off the sample-and-hold n-MOS transistor 15. As a result of this, each sample-and-hold capacitor 16 holds the voltage at that time. Then, the shiftregister 12 is driven for successively turning on the pixel selection n-MOS transistors 9, thus obtaining, via the buffer 14, the signal output of each pixel from the output terminal 14a. By performing the operation in such a way as described above, and by using the circuit configuration described above, the integration starting time becomes the same for all pixels as well as the integration period.

Figure 12:
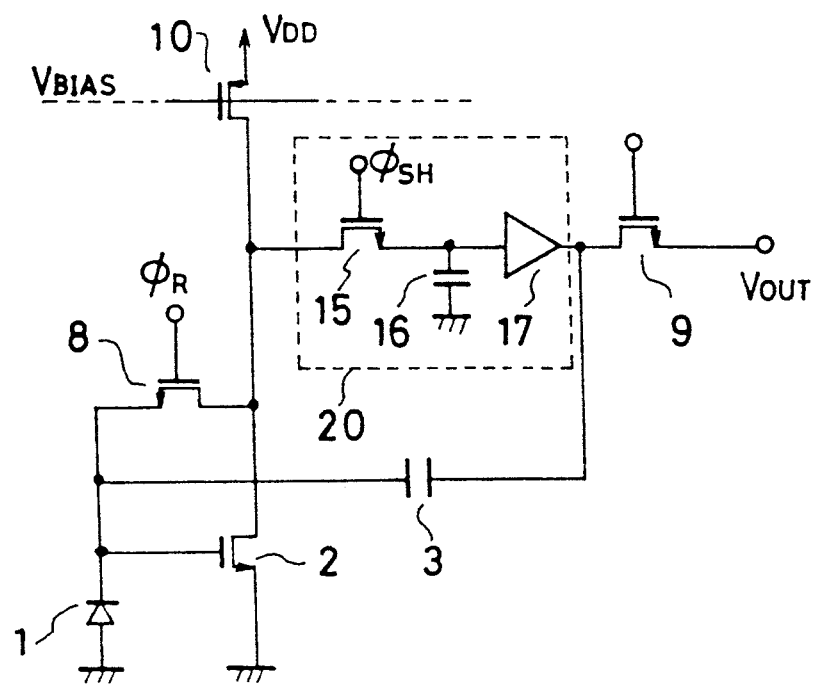
FIG. 12 is a circuit diagram showing yet another embodiment of basic cell.

In the case of the basic cell shown in FIG. 9, the feedback capacitor 3 is connected between the drain and gate of the n-MOS transistor 2. However, as shown in FIG. 12, another basic cell having a feedback capacitor 3 connected between the output of a buffer 17 of a sample-and-hold circuit 20 and the gate of a n-MOS transistor 2 can be also used to operate in the same way as in the case of the basic cell shown in FIG. 9.

The basic cell shown in FIG. 12 can be modified to suppress the variation in offset between each pixel as will be described later in another embodiment. In the case of the basic cells shown in FIGS. 9 and 12, the initial output voltage $V_{OUT}$ is provided by:

$$V_{OUT} = V_{GS} + V_O, \quad (4)$$

where $V_{GS}$ is gate-source voltage determined by the drain current of the n-MOS transistor 2, and $V_O$ is offset voltage of the buffer 17. As can be seen from equation (4), as far as there is no difference in $V_{GS}$ and $V_O$ among all pixels, no problems occur. However, if there is some scatter in $V_{GS}$ or $V_O$ then this scatter causes the scatter in the output voltage and leads to fixed pattern noise.

Figure 13:
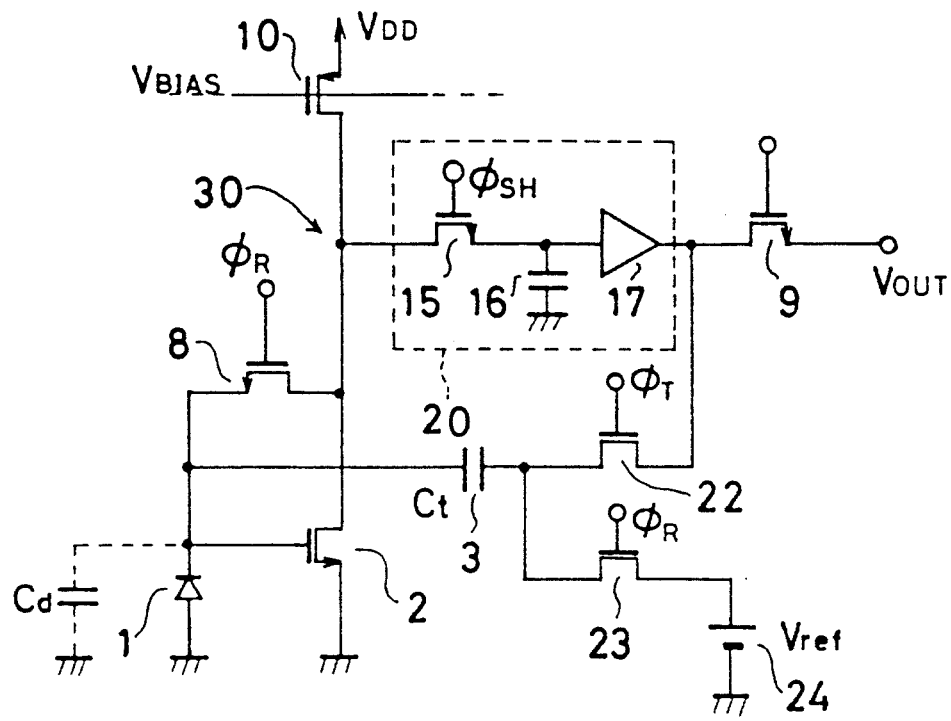
FIG. 13 is a circuit diagram showing still yet another embodiment of basic cell.

FIG. 13 shows a circuit configuration of an embodiment of a basic cell which is improved to suppress the fixed pattern noise. The basic cell of FIG. 13 has the following difference from that of FIG. 12. A feedback capacitor 3 is connected to the output of a buffer 17 via a switching element 22 driven by a pulse $\phi_T$; and one terminal of a switching element 23, whose other terminal is connected to a reference supply voltage 24, is connected to the node between the feedback capacitor 3 and the switching element 22 so that the reference voltage Vref is applied to this node. The switching element 23 is driven by a reset pulse $\phi_R$.

Figure 14:
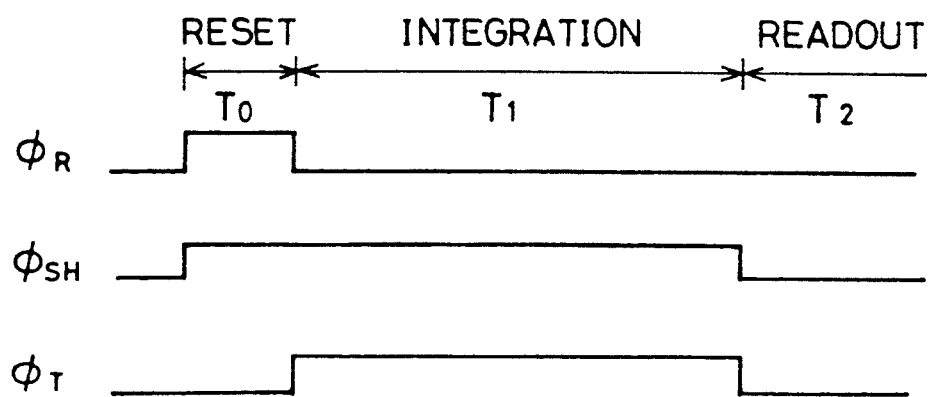
FIG. 14 is a timing chart for explaining an operation of the basic cell shown in FIG. 13.

Referring to the timing chart shown in FIG. 14, the operation of the basic cell configured in the above manner will now be described. In the reset operation (in a period of To), the levels of the reset pulse $\phi_R$ and the sample-and-hold pulse $\phi_{SH}$ are 'H', and a reset transistor 8, a sample-and-hold transistor 15, and the switching element 23 for the reference voltage are in an ON state. As a result, the reference voltage Vref is applied to one terminal of the feedback capacitor 3. Thus, the charges Qd and Qt, provided by the following equations (5) and (6), are stored in the junction capacitance Cd of a photodiode 1 and the capacitance Ct of the capacitor 3, respectively:

$$Qd = Cd \cdot V_{GS} \quad (5)$$

$$Qt = Ct \cdot (V_{GS} - Vref) \quad (6)$$

Then, integration starts (in a period of $T_1$) and the levels of the reset pulse $\phi_R$ and the sample-and-hold pulse $\phi_T$ become 'L' and 'H', respectively, and the reset transistor 8 and the switching element 23 for the reference voltage are turned off, while the feedback switching element 22 is turned on. As a result of this, the voltage at the node 30 in FIG. 13 changes by $\Delta V$. The output voltage $V_{OUT(O)}$ of the buffer 17, and charges Qd' and Qt' of Cd and Ct, at the time just after the integration started, are provided respectively by:

$$V_{OUT(O)} = V_{GS} + \Delta V + V_O, \quad (7)$$

$$Qd' = Cd \cdot (V_{GS} - 1/G \cdot \Delta V), \quad (8)$$

$$Qt' = Ct \cdot \{(V_{GS} - 1/G \cdot \Delta V) - V_{OUT(O)}\}, \quad (9)$$
$$= -Ct \cdot \{(V_O + (1 + 1/G) \cdot \Delta V\},$$

where G is a gain of a common-source amplifier.

The total charge stored in Cd and Ct at the reset time is conserved even at the time just after the integration started. Therefore, the following equation (10) is obtained:

$$Qd + Qt = Qd' + Qt'. \quad (10)$$

From this relationship, the primary approximation of $\Delta V$ is obtained, using $[1/(1+\Delta)] \approx 1 - \Delta$, as follows:

$$\Delta V = \{1 - 1/G \cdot (1 + Cd/Ct)\} \cdot (Vref - V_{GS} - V_O). \quad (11)$$

Hence, from equations (7) and (11), $V_{OUT(O)}$ is provided by:

$$V_{OUT(O)} = Vref - 1/G \cdot (1 + Cd/Ct) \cdot (Vref - V_{GS} -). \quad (12)$$

Comparing equation (12) with equation (4), it can be seen that the scatter in $V_{GS}$ and $V_O$ is reduced by the factor of $1/G \cdot (1 + Cd/Ct)$. Consequently, the suppression of the scatter in offset can be achieved by using the basic cell having the circuit configuration shown in FIG. 13, and by increasing the gain of the common-source amplifier.

Denoting the photocurrent and the integration period by $I_P$ and t, respectively, the output voltage $V_{OUT}$ after completion of the integration is given by:

$$V_{OUT} = V_{OUT(O)} + I_P t / \{(1 + 1/G)Ct + 1/G \cdot Cd\}. \quad (13)$$

In this state, when the level of the sample-and-hold pulse $\phi_{SH}$ is altered from 'H' to 'L', the output voltage $V_{OUT}$ is held by the sample-and-hold capacitor 16. Then, the shiftregister is operated so that a pixel selection transistor 9 is turned on and the output voltage is read out (in the period $T_2$). As described above, it is possible to read out the signal with suppressed fixed pattern noise by using the basic cell having the circuit configuration shown in FIG. 13.

In the above embodiments, line sensors with 1-dimensionally arranged pixels are described. Now, another embodiment according to the present invention applied to an area sensor with 2-dimensionally arranged pixels will be described. Due to the number of pixels used in an area sensor being small enough, it may be achieved by arranging the basic cells shown in a FIG. 7 in 2-dimensional form. However, in the case of a large number of pixels, the basic cell of FIG. 7 leads to the problem that it consumes very high power due to the fact that this basic cell has a steady-state current for biasing.

Figure 15:
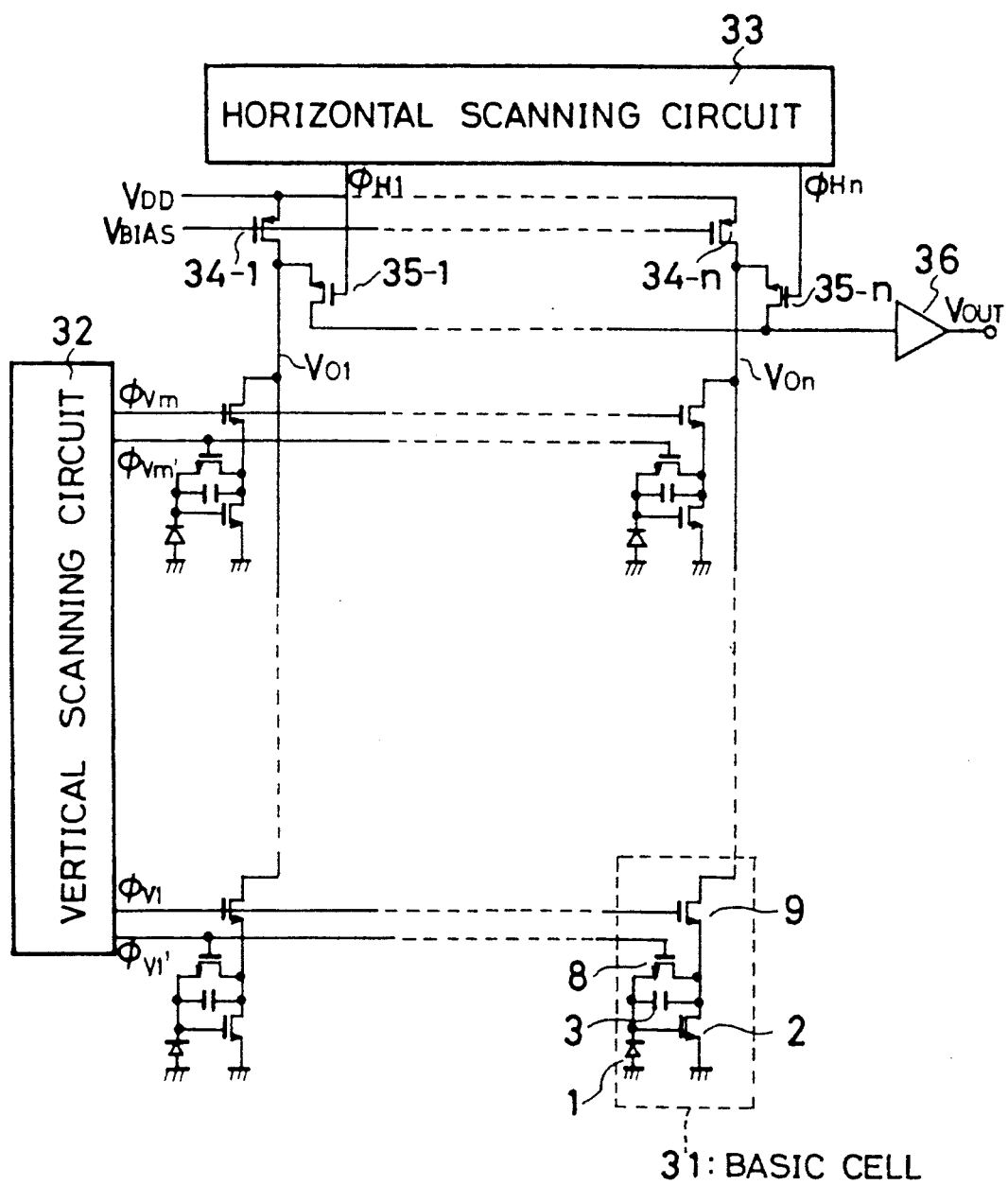
FIG. 15 is a circuit diagram showing an embodiment of a 2-dimensional area sensor.

FIG. 15 shows an embodiment of a 2-dimensional area sensor whose current consumption is reduced, comprising a basic cell 31 composing a pixel, a photodiode 1, a common-source n-MOS transistor 2, a capacitor 3, a reset transistor 8, and a selection transistor 9. Gates of the selection transistors 9 of the basic cells are connected together in common for every row so that main selection signals $\phi_{V1}, \phi_{V2}, \ldots, \phi_{Vm}$ from a vertical scanning circuit 32 are applied to the gates of corresponding row. Gates of the reset transistors 8 of the basic cells are connected together in common for every row so that sub-selection signals $\phi_{V1}', \phi_{V2}', \ldots, \phi_{Vm}'$ are successively applied at intervals of one horizontal scanning period (1 H) from the vertical scanning circuit 32 to these gates to successively select each row of the basic cells arranged in a 2-dimensional form. Drains of the selection transistors 9 of the basic cells are connected together to vertical signal lines $V_{O1}, V_{O2}, \ldots, V_{On}$, in common for every column. These vertical signal lines are connected respectively to active load transistors 34-1, 34-2, ..., 34-n, and also connected to horizontal selection transistors 35-1, 35-2, ..., 35-n which are driven by horizontal pulses $\phi_{H1}, \phi_{H2}, \ldots, \phi_{Hn}$ from a horizontal scanning circuit 33. The horizontal scanning circuit 33 successively selects horizontal selection transistors 35-1, 35-2, ..., 35-n to output each pixel signal via buffer 36 in the form of output voltage $V_{OUT}$ from the output terminal.

Figure 16:
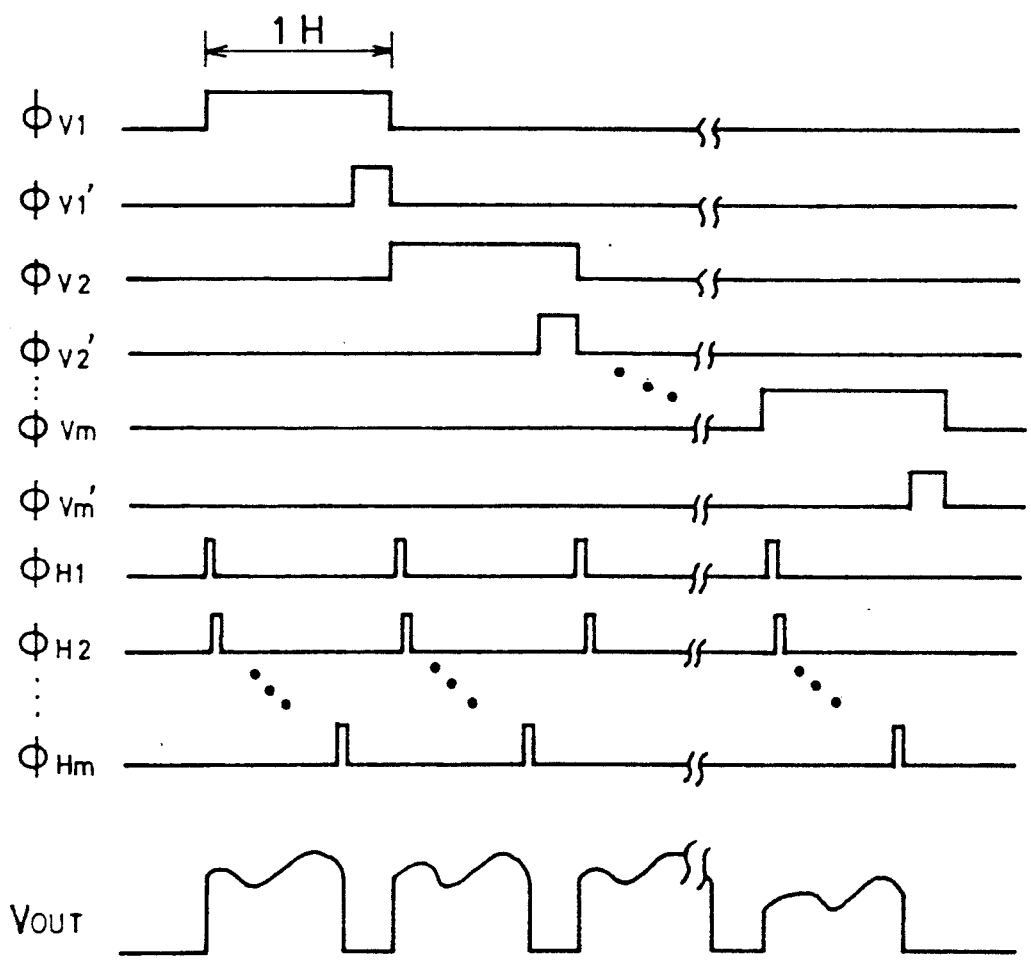
FIG. 16 is a timing chart for explaining an operation of the 2-dimensional area sensor of FIG. 15.

Based on the timing chart shown in FIG. 16, operation of such an area sensor will be described. The main selection signals $\phi_{V1}, \phi_{V2}, \ldots, \phi_{Vm}$ successively have the level of 'H' every intervals of one horizontal scanning period (1 H), so that reading transistors 9 of the basic cells on a specific selected row are turned on during the whole period of 1 H. During that period, horizontal pulses $\phi_{H1}, \phi_{H2}, \ldots, \phi_{Hn}$ are successively output from a horizontal scanning circuit 33 so that the output signal of the pixels on the selected row are successively read out via horizontal selection transistors 35-1, 35-2, ..., 35-n. After that, levels of sub-selection signals $\phi_{V1}', \phi_{V2}', \ldots, \phi_{Vm}'$ of the selected row become 'H' to perform resetting operation. After both reading out by the horizontal scanning and resetting by the sub-selection signal are completed, the next successive row is selected by the main selection signal to perform reading out one line of pixel signals. In this way, all rows are read out to obtain information of one frame data (m × n pixels) of the area sensor.

In this area sensor configured in the above manner, at any given time, the bias current flows in basic cells only on one line. As a result, a large reduction in the current consumption can be achieved compared to the configuration where all pixels (all basic cells) are always biased. In the specific embodiment shown in FIG. 15, a shiftregister is used both for vertical and horizontal selection. However, if a decoder is used for the vertical selection, then the area sensor can be used as a set of line sensors whose selected line may be shifted up and down on a light-receiving surface.

Figure 17:
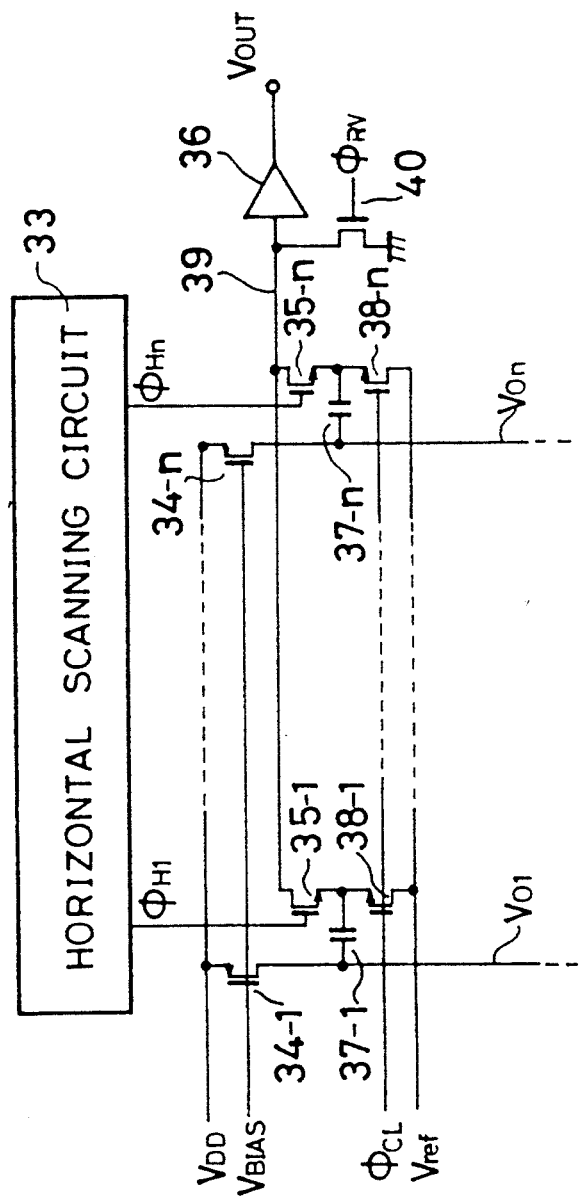
FIG. 17 is a circuit diagram showing a primary portion of another embodiment of 2-dimensional area sensor.

Now, another embodiment of area sensor whose fixed pattern noise is suppressed will be described. Suppression of the fixed pattern noise can be achieved by subtracting the signal voltage obtained just after resetting from the reading out voltage as shown in an embodiment of a circuit diagram illustrated in FIG. 17. This embodiment can be obtained by modifying a part of the horizontal selection circuit of the embodiment shown in FIG. 15. In FIG. 17, the only modified part is shown and the other remaining part may be exactly the same as in the case of FIG. 15. The modification is made in such a way that capacitors 37-1, 37-2, ..., 37-n are inserted in series between horizontal selection transistors 35-1, 35-2, ..., 35-n and vertical signal lines $V_{O1}, V_{O2}, \ldots, V_{On}$, respectively, and to the output nodes of these capacitors 37-1, 37-2, ..., 37-n, are added clamping transistors 38-1, 38-2, ..., 38-n, to one terminal of which the reference voltage Vref is applied, and that there is provided reset transistor 40 connected to the signal output line 39 wherein the reset transistor 40 is driven by a reset pulse $\phi_{RV}$. The clamping transistors 38-1, 38-2, ..., 38-n are driven by a clamping pulse $\phi_{CL}$.

Figure 18A:
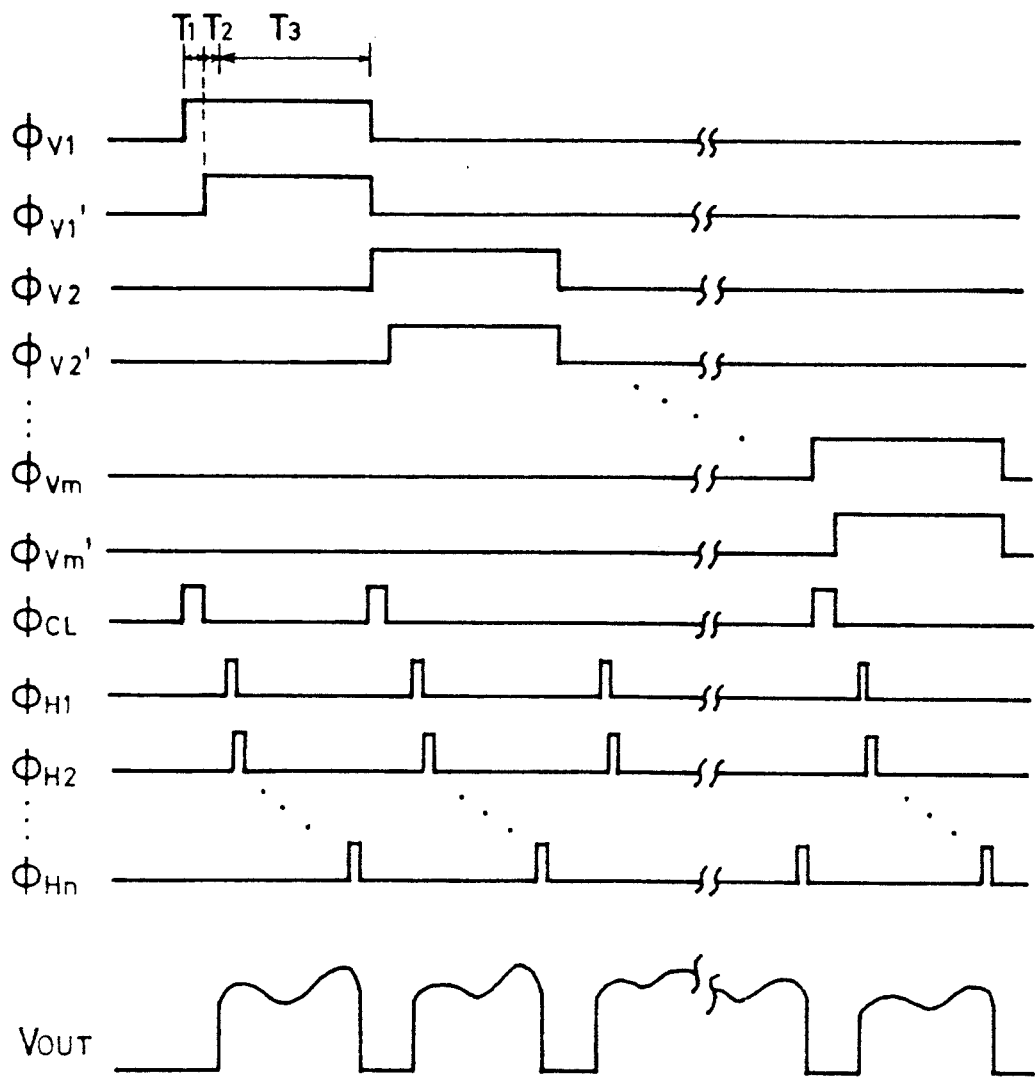
FIGS. 18A and 18B are timing charts for explaining an operation of the 2-dimensional area sensor shown in FIG. 17.
Figure 18B:
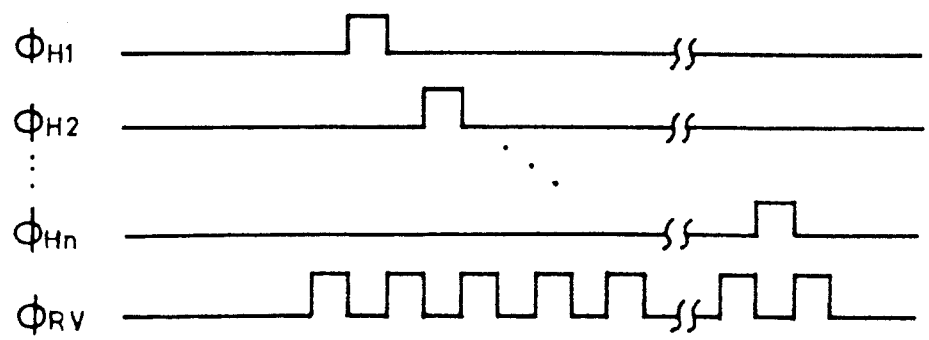

Referring to the timing charts shown in FIGS. 18A and 18B, the operation of such an area sensor will now be described. Since the horizontal selection circuit is modified, timing for sub-selection signals $\phi_{V1}', \phi_{V2}', \ldots, \phi_{Vm}'$ to reset each pixel is also modified. Now, operation during one horizontal scanning period (1 H) in which certain one row is selected will be described. During the period $T_1$, the signal voltage appears on vertical signal lines $V_{O1}, V_{O2}, \ldots, V_{On}$, and the level of clamping pulse $\phi_{CL}$ is kept to 'H' so that the clamping transistors 38-1, 38-2, ..., 38-n are turned on. As a result, the voltages of the capacitors 37-1, 37-2, ..., 37-n are fixed to the reference voltage Vref. At this time, each of these capacitors stores charge Q as provided by the following equation:

$$Q = (V_0 + V_s - V_{ref}) \cdot C_{CL}, \quad (14)$$

where Vs is signal change due to the photo integration, $V_O$ is an offset voltage, and $C_{CL}$ is a capacitance of the capacitors 37-1, 37-2, ..., 37-n.

During the next period $T_2$, the level of the clamping pulse $\phi_{CL}$ is altered to 'L', hence the capacitors 37-1, 37-2, ..., 37-n get in the floating state. Furthermore, the level of sub-selection signal $\phi_{V1}'$ becomes 'H', and the corresponding row is reset. Thus, resetting-time offset voltages $V_O$ appear on the vertical signal lines $V_{O1}, V_{O2}, \ldots, V_{On}$. In this state, during the period $T_3$, as shown in FIG. 18B, while the signal output line 39 is reset by the reset transistor 40, the horizontal selection transistors 35-1, 35-2, ..., 35-n are successively turned on to perform reading operation. Denoting a parasitic capacitance associated with the signal output line 39 by $C_{PA}$, the signal output $V_{OUT}$ is provided by the following equation:

$$V_{OUT} = C_{CL}/(C_{CL} + C_{PA}) \cdot (V_{ref} - V_s), \quad (15)$$

From the comparison between equation (14) and equation (15), it can be seen that in equation (15), there is no longer the offset voltage $V_0$ which exists in equation (14). Thus, the fixed pattern noise due to the scatter in the offset voltage can be suppressed by subtracting the signal voltage obtained just after resetting from the output voltage.

As described above on each embodiment, according to the present invention, in the setting of the sensitivity, the affection of a junction capacitance of a photodiode can be neglected. Thus the sensitivity can be enhance by reducing a feedback capacitance. Furthermore, by setting a bias current of a common-source transistor to a value which is large enough compared to a photocurrent, an accurate photoelectric conversion output can be obtained regardless of the change in amount of incident light.

The above description is included to illustrate the preferred embodiments and the operations thereof, and is not intended to limit the scope of the invention. The scope of the invention is to be limited only by the following claims. From the above discussion, many variations are apparent to one skilled in the art which would yet be encompassed by the spirit and scope of the invention.

What is claimed is:

1. A solid state image pickup device having a photoelectric conversion detection cell, said cell comprising:
   a photodiode having an anode or a cathode thereof which is grounded;
   a transistor for amplification, the gate of said transistor being connected to the cathode or anode of said photodiode, the source of said transistor being grounded, the drain of said transistor being connected to a load; and
   a feed back capacitor and a switching element for resetting, both of which are connected between the drain and gate of said transistor for amplification,
   wherein the gain of a common-source amplifier circuit comprised of said transistor for amplification and said load is set high, so that, during an integration period, the gate-source voltage which is determined by a threshold voltage of said transistor and a bias current flowing in said transistor is constantly applied to said photodiode as a reverse bias voltage, wherein the amount of light incident to said photodiode is output in the form of the change of drain voltage of said transistor for amplification.

2. A solid state image pickup device as defined in claim 1, wherein:
   said transistor for amplification ia a MOS transistor; and
   said load includes a depletion type MOS transistor having a conductivity type which is the same as that of said transistor for amplification.

3. A solid state image pickup device as defined in claim 1, wherein:
   said transistor for amplification is a MOS transistor, and said load includes an active load of a MOS transistor having a conductivity type which is opposite to that of said transistor for amplification.

4. A solid state image pickup device as defined in claim 1, wherein said transistor for amplification includes a MOS transistor having a channel region thereof which is doped with impurity so that the threshold voltage is small enough to reduce the reverse bias voltage applied to said photodiode to thereby suppress generation of dark current.

5. A solid state image pickup device as defined in claim 2, wherein said transistor for amplification includes a MOS transistor having a channel region which is doped with impurity so that the threshold voltage is small enough to reduce the reverse bias voltage applied to said photodiode to thereby suppress generation of dark current.

6. A solid state image pickup device as defined in claim 3, wherein said transistor for amplification includes a MOS transistor having a channel region thereof which is doped with impurity so that the threshold voltage is small enough to reduce the reverse bias voltage applied to said photodiode to thereby suppress generation of dark current.

7. A solid state image pickup device having a photoelectric conversion detection cell, said cell comprising:
   a photodiode having an anode or a cathode thereof which is grounded;
   a transistor for amplification, the gate of said transistor being connected to the cathode or anode of said photodiode, the source of said transistor being grounded, the drain of said transistor being connected to a load;
   a feedback capacitor and a switching element for resetting, both of which are connected between the drain and gate of said transistor for amplification; and
   a sample-and-hold circuit including a switching element and a capacitor for performing operation of sample-and-hold of the drain voltage of said transistor for amplification, and further including a buffer.

8. A solid state image pickup device having a photoelectric conversion detection cell, said cell comprising:
   a photodiode having an anode or a cathode thereof which is grounded;
   a transistor for amplification, the gate of said transistor being connected to the cathode or anode of said photodiode, the source of said transistor being grounded, the drain of said transistor being connected to a load;
   a switching element, for resetting, which is connected between the drain and gate of said transistor for amplification;
   a sample-and-hold circuit including a switching element and a capacitor for performing operation of sample-and-hold of the drain voltage of said transistor for amplification, and further including a buffer; and
   a feedback capacitor connected between the gate of said transistor for amplification and the output of the buffer of said sample-and-hold circuit.

9. A slid state image pickup device having a photoelectric conversion detection cell, said cell comprising:
   a photodiode having an anode or a cathode thereof which is grounded;
   a transistor for amplification, the gate of said transistor being connected to the cathode or anode of said photodiode, the source of said transistor being grounded, the drain of said transistor being connected to a load;
   a switching element, for resetting, which is connected between the drain and gate of said transistor for amplification;
   a sample-and-hold circuit including a switching element and a capacitor for performing operation of sample-and-hold of the drain voltage of said transistor for amplification, and further including a buffer;
   a feedback capacitor one terminal of which is connected to the gate of said transistor for amplification;
   a feedback witching element connected between the other terminal of said feedback capacitor and the output of the buffer of said sample-and-hold circuit; and
   a switching element for applying a reference voltage by connecting a reference voltage source to a node between said feedback capacitor and said feedback switching element.

10. A solid state image pickup device having basic cells, each of said cells comprising:
    a photodiode having an anode or a cathode thereof which is grounded;
    a transistor for amplification, the gate of said transistor being connected to the cathode or anode of said photodiode, the source of said transistor being grounded, the drain of said transistor being connected to a pixel selection switching element connected to a signal output line; and a feedback capacitor and a switching element for resetting, both of which are connected between the drain and gate of said transistor for amplification, wherein a plurality of said basic cells are arranged and a load is connected to the signal output line which is connected to the pixel selection switching element of each basic cell whereby resetting and reading are performed by turning on said pixel selection switching element of the basic cell during resetting and reading operation.

11. A solid state image pickup device having basic cells, each of said cells comprising:

a photodiode having an anode or a cathode thereof which is grounded;

a transistor for amplification, the gate of said transistor being connected to the cathode or anode of said photodiode, the source of said transistor being grounded, the drain of said transistor being connected to a first pixel selection switching element connected to a vertical signal line;

a feedback capacitor and a switching element for resetting, both of which are connected between the drain and gate of said transistor for amplification, wherein said solid state image pickup device includes an array of a plurality of said basic cells;

a load connected to a vertical signal line which is connected to the first pixel selection switching element;

a second pixel selection switching element which is connected to a video signal output line and is also connected via a clamping capacitor to said vertical signal line; and a clamping switching element for supplying a reference voltage connected to a node between said clamping capacitor and said second pixel selection switching element, wherein:

said first pixel selection switching element is turned on, the clamping switching element is turned on and the second pixel selection switching element is turned off so that a signal voltage of he basic cell is read out, then the clamping switching element is turned off to perform resetting of the corresponding basic cell, and while the second pixel selection switching elements are successively turned on, the difference between the reading voltage and reset voltage is output from the video signal output line.

* * * * *